US010754361B2

(12) United States Patent
Takijiri et al.

(10) Patent No.: US 10,754,361 B2
(45) Date of Patent: Aug. 25, 2020

(54) FLOW RATE CONTROL APPARATUS, FLOW RATE CONTROL METHOD, AND PROGRAM FOR A FLOW RATE CONTROL APPARATUS

(71) Applicant: HORIBA STEC, Co., Ltd., Kyoto-shi, Kyoto (JP)

(72) Inventors: Koutaro Takijiri, Kyoto (JP); Kentaro Nagai, Kyoto (JP); Yuko Imasato, Kyoto (JP); Tsai Wei Tseng, Kyoto (JP); Kazuhiro Matsuura, Kyoto (JP)

(73) Assignee: HORIBA STEC, Co., Ltd., Kyoto-shi, Kyoto (JP)

( * ) Notice: Subject to any disclaimer, the term of this patent is extended or adjusted under 35 U.S.C. 154(b) by 54 days.

(21) Appl. No.: 16/297,004

(22) Filed: Mar. 8, 2019

(65) Prior Publication Data
US 2019/0278305 A1 Sep. 12, 2019

(30) Foreign Application Priority Data

Mar. 12, 2018 (JP) .................................. 2018-044413

(51) Int. Cl.
G05D 7/06 (2006.01)
H01L 21/67 (2006.01)
(52) U.S. Cl.
CPC ..... G05D 7/0635 (2013.01); H01L 21/67017 (2013.01)
(58) Field of Classification Search
CPC .................. G05D 7/0635; H01L 21/67017
See application file for complete search history.

(56) References Cited

U.S. PATENT DOCUMENTS

| 7,979,165 B2* | 7/2011 | Gotoh et al. .......... G01F 1/6847 137/2 |
| 10,503,179 B2* | 12/2019 | Hayashi et al. ..... G05D 7/0635 |
| 2013/0092258 A1* | 4/2013 | Yasuda et al. ....... G05D 7/0635 137/487 |

FOREIGN PATENT DOCUMENTS

JP 2004280688 A 10/2004

* cited by examiner

Primary Examiner — Kevin L Lee
(74) Attorney, Agent, or Firm — Alleman Hall Creasman & Tuttle LLP

(57) ABSTRACT

In order to provide a flow rate control apparatus that estimates a flow rate actually flowing at a control point without a large amount of noise, there are provided a fluid resistor that is provided on a flow path, a downstream-side valve that is provided on a downstream side of the fluid resistor, a resistance flow rate measurement mechanism that measures a resistance flow rate that flows through the fluid resistor, and flows into a volumetric space located on the flow path between this fluid resistor and the downstream-side valve, a subject flow rate estimation part that estimates a valve flow rate based on the flow rate characteristics stored in the flow rate characteristics storage part, and a flow rate control unit that controls the downstream-side valve based on a set flow rate, and on the valve flow rate estimated by the subject flow rate estimation part.

9 Claims, 7 Drawing Sheets

FLOW RATE CONTROL APPARATUS, FLOW RATE CONTROL METHOD, AND PROGRAM FOR A FLOW RATE CONTROL APPARATUS

TECHNICAL FIELD

The present invention relates to a flow rate control apparatus that is used to control a flow rate of a fluid that is used, for example, in a semiconductor manufacturing device.

TECHNICAL BACKGROUND

In a semiconductor manufacturing process, a flow rate control apparatus which is known as a mass flow controller and in which are packaged various types of fluid instruments and control mechanisms is used in order to control flow rates of various types of gases that are introduced, for example, into an etching chamber.

A mass flow controller is provided, for example, with a flow rate sensor that is provided on a flow path, a valve that is provided on a downstream side of the flow rate sensor, and a flow rate control part that controls an valve opening of the valve such that a measured flow rate that is measured by the flow rate sensor matches a set flow rate which is a target value (see Patent Document 1).

In a mass flow controller such as this, because the measurement point of the flow rate sensor and the control point of the valve on the flow path are mutually separated by the distance between the locations where the respective devices are installed, a delay is generated in the control, particularly in the case of a transient response.

In order to solve this type of problem, attempts have been made to eliminate the delay in the control by estimating the valve flow rate actually flowing at the control point, and then feeding back this estimated valve flow rate. More specifically, a pressure within a volumetric space between the flow rate sensor and the valve is measured by a pressure sensor, and the valve flow rate, which is the flow rate at the control point, is estimated from differential values of this pressure and the flow rate measured by the flow rate sensor.

However, if a differential operation is performed when, for example, high frequency noise is present in the pressure measured by the pressure sensor, then a greater level of noise also becomes attached to the estimated valve flow rate. If a valve flow rate that contains a large noise component such as this is then fed back, there is a possibility that the control of the valve will become unstable.

DOCUMENTS OF THE PRIOR ART

Patent Documents

Patent document 1 Japanese Unexamined Patent Application (JP-A) No. 2004-280688

DISCLOSURE OF THE INVENTION

Problems to be Solved by the Invention

The present invention was therefore conceived in consideration of the above-described problems, and it is an object thereof to provide a flow rate control apparatus that estimates a flow rate actually flowing at a control point without including a large amount of noise therein, and that is able to achieve faster flow rate control while enabling stability to be ensured in the flow rate control.

Means for Solving the Problem

Namely, a flow rate control apparatus according to the present invention includes a fluid resistor that is provided on a flow path, a downstream-side valve that is provided on a downstream side of the fluid resistor, a resistance flow rate measurement mechanism that measures a resistance flow rate that flows through the fluid resistor, and flows into a volumetric space located on the flow path between this fluid resistor and the downstream-side valve, a flow rate characteristics storage part in which are stored flow rate characteristics that show a relationship between an valve opening related value which is related to an valve opening of the downstream-side valve, a pressure on an upstream side of the downstream-side valve, and a volumetric space internal flow rate flowing through an interior of the volumetric space, a subject flow rate estimation part that estimates a valve flow rate based on the flow rate characteristics stored in the flow rate characteristics storage part, and a flow rate control part that controls the downstream-side valve based on a set flow rate, and on the valve flow rate estimated by the subject flow rate estimation part, wherein the subject flow rate estimation part is configured so as to estimate a valve flow rate based on the valve opening related value achieved by the flow rate control part, the measured upstream-side pressure, and the flow rate estimated based on the flow rate characteristics, and also on the resistance flow rate measured by the resistance flow rate measurement mechanism.

A flow rate control method according to the present invention uses a flow rate control device that includes a fluid resistor that is provided on a flow path, a downstream-side valve that is provided on a downstream side of the fluid resistor, and a resistance flow rate measurement mechanism that measures a resistance flow rate that flows through the fluid resistor, and flows into a volumetric space located on the flow path between this fluid resistor and the downstream-side valve, and includes a flow rate characteristics acquisition step in which are acquired flow rate characteristics that show a relationship between an valve opening related value which is related to an valve opening of the downstream-side valve, a pressure on an upstream side of the downstream-side valve, and a volumetric space internal flow rate flowing through an interior of the volumetric space, a valve flow rate estimation step in which a valve flow rate is estimated based on the flow rate characteristics acquired in the flow rate characteristics acquisition step, and a flow rate control step in which the downstream-side valve is controlled based on a set flow rate, and on the valve flow rate estimated in the subject flow rate estimation step, wherein, in the subject flow rate estimation step, the valve flow rate is estimated based on the valve opening related value achieved in the flow rate control step, the measured upstream-side pressure, and the flow rate estimated based on the flow rate characteristics, and also on the resistance flow rate measured by the resistance flow rate measurement mechanism.

If this type of structure is employed, then by acquiring flow rate characteristics in advance via, for example, experimentation, it becomes possible, without performing a differential operation, to estimate corresponding valve flow rates from the flow rate characteristics, and from the valve opening related value achieved by the flow rate control part and the pressure that is measured on the upstream side of the downstream-side valve. Here, the valve opening related value that is achieved may be a value obtained when the valve opening of the downstream-side valve is measured by a displacement sensor or the like, or may be a voltage or the
} like applied to the downstream-side valve, or may be a manipulated variable output from the flow rate control part.

Accordingly, even if the subject flow rate estimation part does estimate a valve flow rate, it is difficult for a large noise component to be superimposed on that valve flow rate. Because of this, faster flow rate control can be achieved using estimated valve flow rates at the same time as stable flow rate control is also achieved.

In order to ensure that differential operations and difference operations between actually measured values on which noise is superimposed are not performed when estimating a valve flow rate, and to thereby prevent noise from being amplified, and at the same time to ensure that, even if, for example, a state is considerably changed because of an external disturbance, this change is reflected in the estimated valve flow rate, it is also possible for the subject flow rate estimation part to include a volumetric space internal flow rate estimation part that estimates an internal flow rate inside a volumetric space based on the valve opening related value, the pressure on the upstream side of the downstream-side valve, and the flow rate characteristics, and a valve flow rate estimation part that estimates a valve flow rate flowing out from the volumetric space via the downstream-side valve based on the measured resistance flow rate, and on the estimated volumetric space internal flow rate.

In order enable a valve flow rate to be accurately estimated from a relationship between a flow rate flowing into a volumetric space between the fluid resistor and the downstream-side valve and a flow rate flowing out from this volumetric space, it is also possible for the valve flow rate estimation part to estimate a valve flow rate based on a difference between a resistance flow rate and a volumetric space internal flow rate.

In order to ensure that noise components contained in the pressure on the upstream side of the downstream-side valve or in the valve opening related value, which value is calculated or measured in the flow rate control apparatus do not become amplified and appear in the estimated valve flow rate, it is also possible for the flow rate characteristics to be configured by a multivariable function in which the valve opening related value and the pressure on the upstream side of the downstream-side valve form input variables, and the valve flow rate forms an output variable, and for this multivariable function to not include a differential operator that influences the input variables.

As an example of a specific embodiment of the flow rate control apparatus according to the present invention, the resistance flow rate estimation mechanism is provided with an upstream-side pressure sensor that is provided on an upstream side of the fluid resistor, a downstream-side pressure sensor that measures a pressure in a volumetric space in the flow path between the fluid resistor and the downstream-side valve, and a resistance flow rate calculation part that calculates a resistance flow rate based on the upstream-side pressure measured by the upstream-side pressure sensor, and on the downstream-side pressure measured by the downstream-side pressure sensor, wherein the flow rate control part is configured so as to output a manipulated variable that is input into the downstream-side valve based on a deviation between a set flow rate and a valve flow rate, and the subject flow rate estimation part is configured so as to estimate a valve flow rate based on the upstream-side pressure measured by the upstream-side pressure sensor, which is the pressure on the upstream side of the downstream-side valve, on the manipulated variable output by the flow rate control part, which is the valve opening related value, and on the flow rate characteristics.

If this type of structure is employed, then because the subject flow rate estimation part estimates a valve flow rate using the pressure on the upstream side of the fluid resistor instead of the downstream-side pressure, which is the pressure inside the volumetric space, even if the pressure inside the volumetric space abruptly changes due to the valve opening of the downstream-side valve being altered, it is possible to inhibit the effects of this from appearing. Because of this, it is possible to prevent the estimated volumetric space internal flow rate and the valve flow rate from undergoing large variations, and to thereby further improve the stability of the flow rate control.

In addition, because a manipulated variable output by the flow rate control part is used as the valve opening related value, it is not necessary to directly measure the valve opening of the downstream-side valve, so that the structure of the control system can be simplified.

In order to make it possible to achieve more robust control in which it is more difficult for valve flow rate variations to occur even if pressure variations are generated on the upstream side of the fluid resistor after the valve flow rate has been stabilized at a set flow rate by the downstream-side valve, it is also possible for there to be further provided an upstream-side valve that is provided on the upstream side of the fluid resistor, and a pressure control part that controls the upstream-side valve based on the set pressure and on the upstream-side pressure measured by the upstream-side pressure sensor.

In order to enable the same type of effects as those obtained from the flow rate control apparatus according to the present invention to be attained simply by updating a program for an existing flow rate control apparatus, it is possible to employ a program that is used in a flow rate control apparatus that includes a fluid resistor that is provided on a flow path, a downstream-side valve that is provided on a downstream side of the fluid resistor, and a resistance flow rate measurement mechanism that measures a resistance flow rate that flows through the fluid resistor, and flows into a volumetric space located on the flow path between this fluid resistor and the downstream-side valve, the program enabling a computer to function as a flow rate characteristics storage part in which are stored flow rate characteristics that show a relationship between an valve opening related value which is related to an valve opening of the downstream-side valve, a pressure on an upstream side of the downstream-side valve, and a volumetric space internal flow rate flowing through an interior of the volumetric space, as a subject flow rate estimation part that estimates a valve flow rate based on the flow rate characteristics stored in the flow rate characteristics storage part, and as a flow rate control part that controls the downstream-side valve based on a set flow rate, and on the valve flow rate estimated by the subject flow rate estimation part, wherein the subject flow rate estimation part is configured so as to estimate a valve flow rate based on the valve opening related value achieved by the flow rate control part, the measured upstream-side pressure, and the flow rate estimated based on the flow rate characteristics, and also on the resistance flow rate measured by the resistance flow rate measurement mechanism.

It is also possible for the program for a flow rate control apparatus to be electronically distributed, or to be recorded on a recording medium such as a CD, DVD, HDD, or flash memory or the like.

Effects of the Invention

According to the above-described flow rate control apparatus according to the present invention, it is possible to estimate, as the valve flow rate, a flow rate actually flowing in a downstream-side valve without using a differential operation. Accordingly, even if noise is present in a measured pressure, it is possible to prevent that noise from being amplified and reflected in the valve flow rate. Because of this, faster flow rate control can be achieved at the same time as this flow rate control is stabilized.

BEST EMBODIMENTS FOR IMPLEMENTING THE INVENTION

A flow rate control apparatus 100 according to a first embodiment of the present invention will now be described with reference to FIG. 1 through FIG. 4.

The flow rate control apparatus 100 of the first embodiment is used, for example, in a semiconductor manufacturing process to supply gas at a set flow rate to an etching chamber. Here, the set flow rate is a step signal that rises or falls in a step-shape manner from one particular flow rate value to another flow rate value. The flow rate control apparatus 100 is configured such that it tracks this step signal within a predetermined time that is set, for example, in accordance with the quality of the semiconductor being manufactured.

Figure 1:
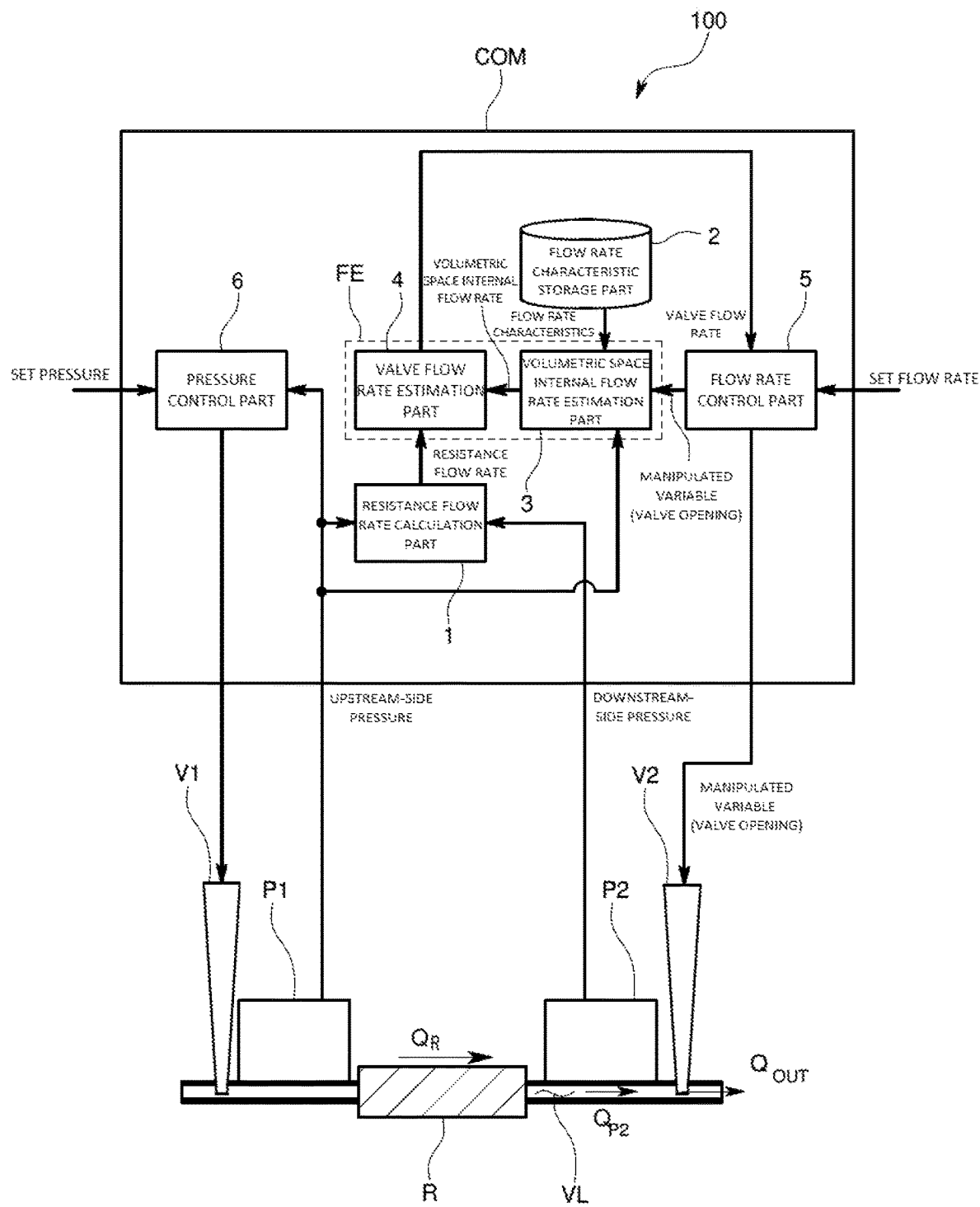
FIG. 1 is a schematic view showing a flow rate control apparatus according to a first embodiment of the present invention.

In other words, as is shown in FIG. 1, the flow rate control apparatus 100 is provided with sensors that are disposed on a flow path, fluid instruments configured by valves, and a control device COM that governs the control of these fluid instruments. Note that the function block diagram in FIG. 1 shows an operating state at a second and subsequent control cycle which takes place after a first control cycle, which is performed using initial values, has ended.

An upstream-side valve V1, an upstream-side pressure sensor P1, a fluid resistor R, a downstream-side pressure sensor P2, and a downstream-side valve V2 are provided on the flow path in that sequence from the upstream side. Here, the fluid resistor R is, for example, a laminar flow element, and generates differential pressure in accordance with the flow rate of the gas flowing on either side thereof.

The upstream-side pressure sensor P1 measures an upstream-side pressure, which is the pressure of a gas used to charge an interior of an upstream-side volumetric space, which is the volume of the flow path between the upstream-side valve V1 and the fluid resistor R.

The downstream-side pressure sensor P2 measures a downstream-side pressure, which is the pressure of a gas used to charge a downstream-side volumetric space VL, which is the volume of the flow path between the fluid resistor R and the downstream-side valve V2.

In this way, the upstream-side pressure sensor P1 and the downstream-side pressure sensor P2 respectively measure the two volumetric spaces configured by the upstream-side valve V1, the fluid resistor R, and the downstream-side valve V2. To express this another way, the upstream-side pressure sensor P1 and the downstream-side pressure sensor P2 respectively measure the pressures inside the two volumetric spaces disposed in front of and behind the fluid resistor R.

In the first embodiment, the upstream-side valve V1 and the downstream-side valve V2 are configured by the same type of valve, and are, for example, piezo valves in which a valve body is driven relative to the valve housing by a piezo element. The upstream-side valve V1 controls the pressure inside the upstream-side volumetric space based on the upstream-side pressure measured by the upstream-side pressure sensor P1. In contrast, the downstream-side valve V2, which is provided on the downstream-most side out of the fluid instruments, controls the overall flow rate of a gas flowing out from the fluid instruments.

Next, the control device COM will be described.

The control device COM is what is known as a computer that is equipped, for example, with a CPU, memory, an AD-DA converter, and input/output devices. As a result of a program for a fluid control apparatus that is stored in the memory being executed so that the respective instruments all operate in mutual collaboration, as is shown in the function block diagram in FIG. 1, the control device COM exhibits the functions of at least a resistance flow rate calculation part 1, a flow rate characteristics storage part 2, a subject flow rate estimation part FE, a valve flow rate estimation part 4, a flow rate control part 5, and a pressure control part 6.

The resistance flow rate calculation part 1 forms part of a resistance flow rate measurement mechanism that measures the flow rate of a gas that flows through the fluid resistor R in addition to the upstream-side pressure sensor P1 and the downstream-side pressure sensor P2, and flows into the fluid resistor R and the downstream-side volumetric space VL. The fluid resistor R and the resistance flow rate measurement mechanism form what is known as a pressure-based flow rate sensor. More specifically, the resistance flow rate calculation part 1 receives inputs of upstream-side pressures measured by the upstream-side pressure sensor P1 and downstream-side pressures measured by the downstream-side pressure sensor P2, and calculates and then outputs a resistance flow rate $Q_R$, which is the flow rate of the gas flowing through the fluid resistor R. Here, a known calculation formula can be used as the flow rate calculation formula used by the resistance flow rate calculation part 1. The resistance flow rate $Q_R$ calculated by the resistance flow rate calculation part 1 changes continuously, however, a predetermined time delay is generated compared to the actual flow rate passing through the downstream-side valve V2 that is achieved via the control of the downstream-side valve V2. This is because of the time taken for a change in the flow rate to reach the resistance flow rate calculation potion 1, which is in turn caused by the fluid resistor R being located a predetermined distance on the upstream side of the downstream-side valve V2.

The flow rate characteristics storage part 2 stores flow rate characteristics that show a relationship between an valve opening related value that is related to the valve opening of the downstream-side valve V2, a pressure on the upstream side of the downstream-side valve V2, and a valve flow rate $Q_{OUT}$, which is the flow rate passing through the downstream-side valve V2 that serves as a flow rate control point. In the first embodiment, the valve opening related value is a manipulated variable that is input into the downstream-side valve V2 by the flow rate control part 5 (described below). Additionally, the pressure on the upstream side of the downstream-side valve V2 is the pressure within the volumetric space between the fluid resistor R and the downstream-side valve V2.

The flow rate characteristics are in the form of a map expressed by a function, for example, whose input variables are configured by the valve opening related value and the pressure on the upstream side of the downstream-side valve V2, and whose output variable is configured by the valve flow rate $Q_{OUT}$, which is the flow rate passing through the downstream-side valve V2 that serves as a flow rate control point. This function is determined by performing experiments in advance. More specifically, in the first embodiment, because the downstream side of the downstream-side valve V2 is placed in a vacuum, it is treated as having a substantially uniform pressure, and a combination of the downstream-side pressure, which is the pressure inside the downstream-side volumetric space VL that is measured by the downstream-side pressure sensor P2, and the manipulated variables input into the downstream-side valve V2 is then suitably altered so that a normal state is attained. When this normal state is attained, the resistance flow rate $Q_R$, and the valve flow rate $Q_{OUT}$ passing through the downstream-side valve V2 are measured by a pressure-based flow rate sensor. Here, because the flow rate at the control point of the downstream-side valve V2 cannot be measured directly, the flow rate in the normal state, for example, when the flow rate is constant is measured by a reference flow rate sensor (not shown in the drawings) provided on the downstream side of the downstream-side valve V2.

Moreover, the function showing flow rate characteristics obtained in this manner does not include a time differential operator that operates in response to each input variable, and is expressed, for example, by a polynomial equation of each input variable.

The subject flow rate estimation part FE receives inputs of the valve opening related values and the pressure on the upstream side of the downstream-side valve V2, and estimates the valve flow rate $Q_{OUT}$ based on flow rate characteristics stored in the flow rate characteristic storage part 2. In the first embodiment, an valve opening related value from the flow rate control part 5 is used as the valve opening related value, and a manipulated variable is input from the flow rate control part 5 into the downstream-side valve V2. In addition, the upstream-side pressure measured by the upstream-side pressure sensor P1 and the downstream-side pressure measured by the downstream-side pressure sensor P2 are both input as the pressure on the upstream side of the upstream-side valve V2 only in the first control cycle. In the second and subsequent control cycles, only the upstream-side pressure measured by the upstream-side pressure sensor P1 is input. This subject flow rate estimation part FE firstly estimates a volumetric space internal flow rate $Q_{P2}$ (described below), and then estimates the valve flow rate $Q_{OUT}$ from the differential between this estimated volumetric space internal flow rate $Q_{P2}$, and the resistance flow rate $Q_R$ actually measured by the pressure-based flow rate sensor. In order to achieve this type of function, in the first embodiment, the subject flow rate estimation part FE is provided with a volumetric space interior flow rate estimation part 3 that estimates the volumetric space internal flow rate $Q_{P2}$, and the valve flow rate estimation part 4 that estimates the valve flow rate $Q_{OUT}$.

The volumetric space interior flow rate estimation part 3 estimates the volumetric space internal flow rate $Q_{P2}$ based on the valve opening related value, the pressure on the upstream side of the downstream-side valve V2, and the flow rate characteristics. The volumetric space internal flow rate $Q_{P2}$ is the flow rate flowing through the volumetric space VL of the flow path between the fluid resistor R and the downstream-side valve V2. More specifically, the volumetric space internal flow rate $Q_{P2}$ is the flow rate flowing in and out of the interior of the volumetric space VL of the flow path, and is defined as a difference between the resistance flow rate $Q_R$, which is the flow rate flowing into the interior of the volumetric space VL, and the valve flow rate $Q_{OUT}$, which is the flow rate flowing out from the interior of the volumetric space VL. In this embodiment, the volumetric space internal flow rate $Q_{P2}$ is defined as a positive value if the resistance flow rate $Q_R$ is greater than the valve flow rate $Q_{OUT}$, while if the resistance flow rate $Q_R$ is smaller than the valve flow rate $Q_{OUT}$, then the volumetric space internal flow rate $Q_{P2}$ is defined as a negative value. In other words, the positivity or negativity of the volumetric space internal flow rate $Q_{P2}$ does not show the direction of flow of a fluid inside the flow path, but instead shows which of the flow rate flowing into the volumetric space VL and the flow rate flowing out from the volumetric space VL is the larger.

The upstream-side pressure measured by the upstream-side pressure sensor P1 is input into the volumetric space interior flow rate estimation part 3 as the pressure on the upstream side of the downstream-side valve V2. Note that, in FIG. 1, because an operating state in effect during the second and subsequent control cycles is shown, a state is shown in which only the manipulated variables and the upstream-side pressure are input into the volumetric space interior flow rate estimation part 3 as actually measured values. The downstream-side pressure actually measured by the downstream-side pressure sensor P2 is only input once, which is during the operation performed using the initial values.

Figure 2:
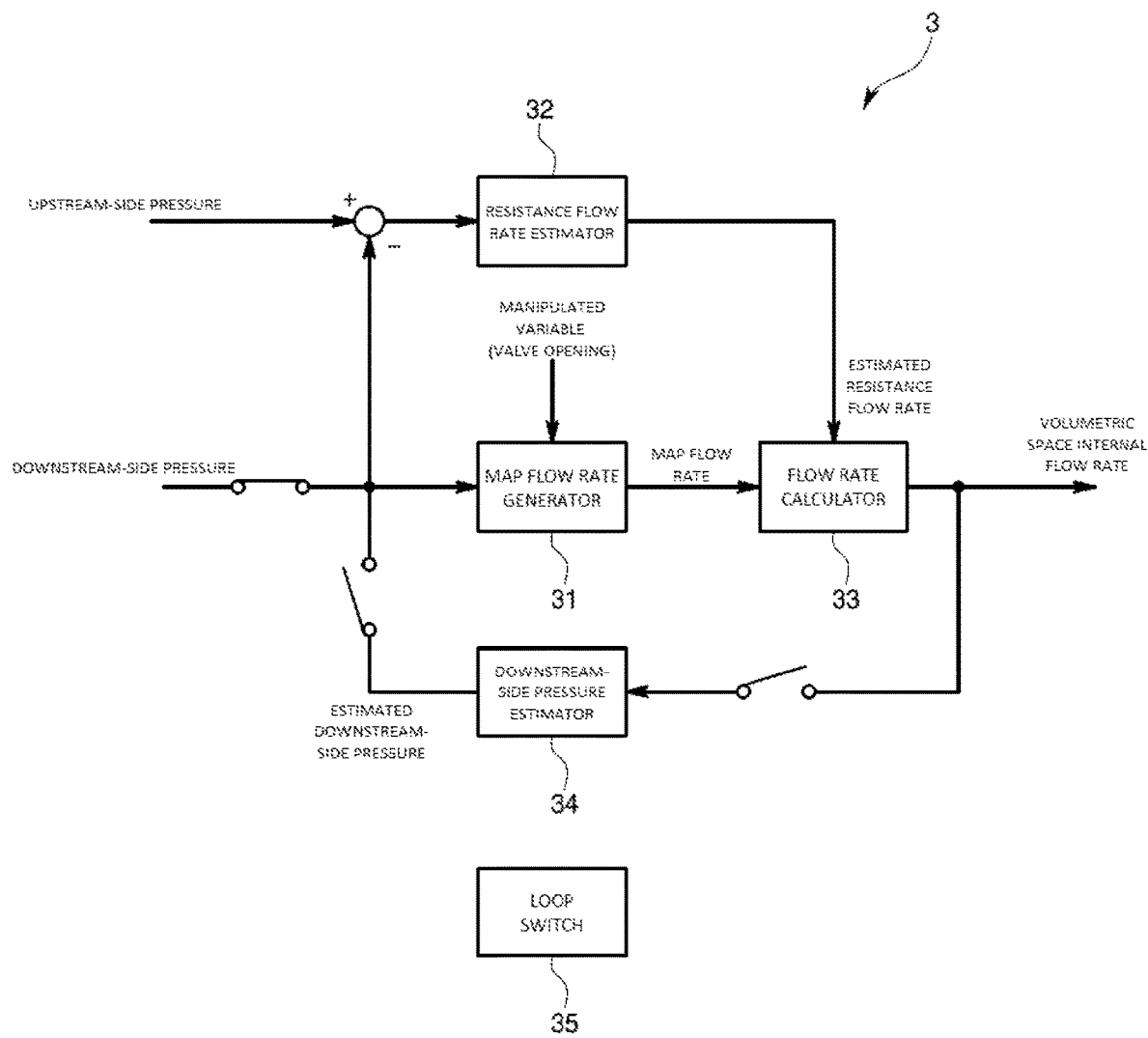
FIG. 2 is a schematic block diagram showing an operation performed using an initial value of a volumetric space internal flow rate estimation part of the first embodiment.
Figure 3:
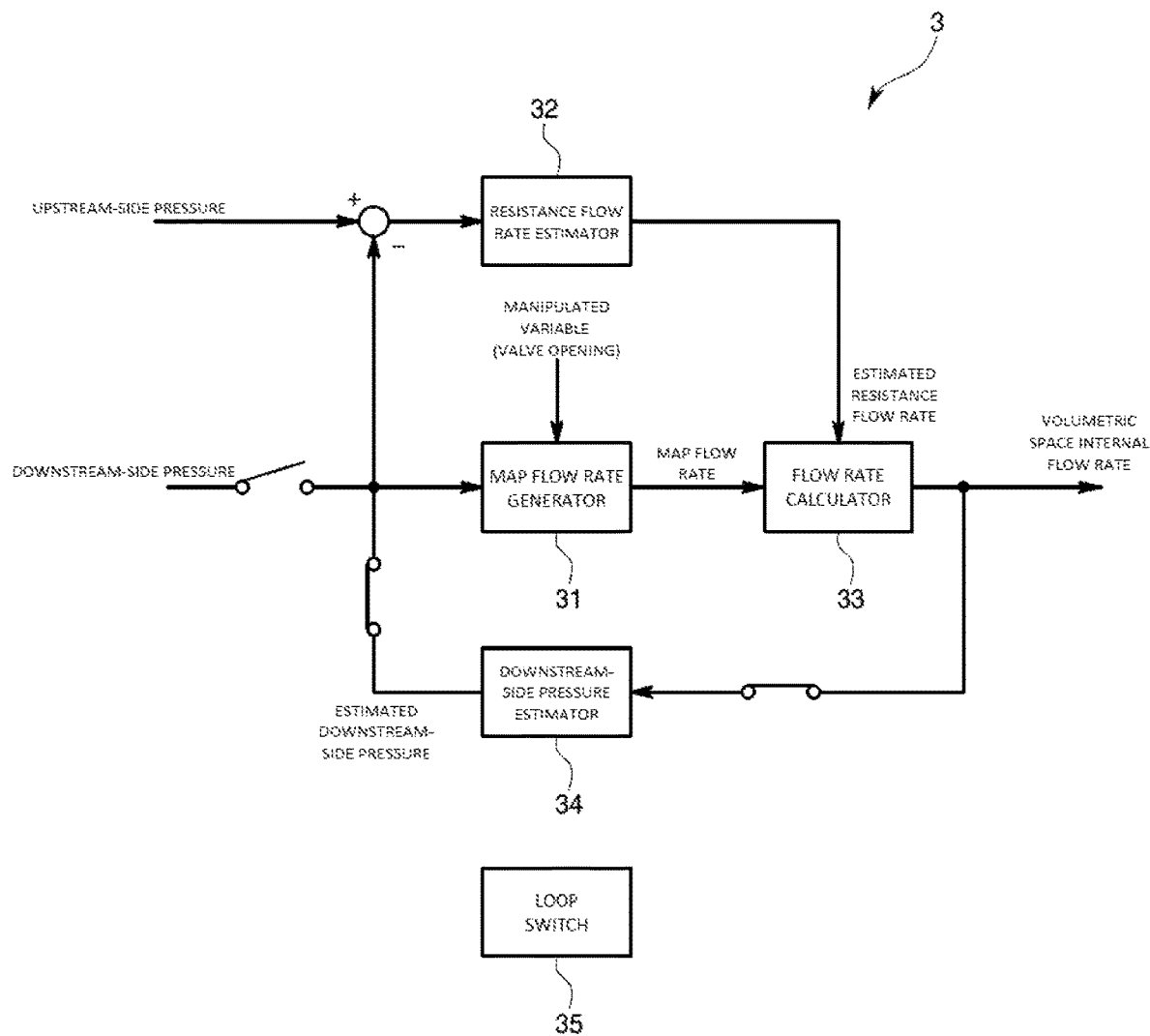
FIG. 3 is a schematic block diagram showing an operation performed in a second and subsequent control cycles of the volumetric space internal flow rate estimation part of the first embodiment.

The structure of the volumetric space interior flow rate estimation part 3 will now be described in detail with reference to FIG. 2 and FIG. 3. FIG. 2 is a control block diagram showing a state of the volumetric space interior flow rate estimation part 3 during an initial control cycle. FIG. 3 is a control block diagram showing a state of the volumetric space interior flow rate estimation part 3 during a second and subsequent control cycles.

As is shown in FIG. 3, in the second and subsequent control cycles, the volumetric space interior flow rate estimation part 3 does not use actually measured values of the downstream-side pressure, but instead, using estimated values for the downstream-side pressure obtained by integrating the volumetric space interior flow rates $Q_{P2}$ estimated in the current control cycle, estimates the volumetric space internal flow rate $Q_{P2}$ for the subsequent control cycle.

More specifically, as is shown in FIG. 2 and FIG. 3, the volumetric space interior flow rate estimation part 3 is provided with a map flow rate generator 31, a resistance flow rate estimator 32, a flow rate calculator 33, a downstream-side pressure estimator 34, and a loop switch 35.

As is shown in FIG. 2 and FIG. 3, the loop switch 35 switches control loops. More specifically, as is shown in FIG. 2, during the initial control cycle, the loop switch 35 enables the downstream-side pressure measured by the downstream-side pressure sensor P2 in the map flow rate generator 31 to be input into the map flow rate generator 31 and the resistance flow rate estimator 32, and ensures that the downstream-side pressure estimator 34 is not operated. In contrast, as is shown in FIG. 3, during the second and subsequent control cycles, the loop switch 35 does not use the downstream-side pressure measured by the downstream-side pressure sensor P2, but instead enables the downstream-side pressure estimated by the downstream-side pressure estimator 34 to be input into the map flow rate generator 31 and the resistance flow rate estimator 32.

The map flow rate generator 31 outputs a map flow rate which is the valve flow rates $Q_{OUT}$ estimated based on the valve opening related value, the downstream-side pressure, and the flow rate characteristics. Here, a map flow rate is obtained by estimating the valve flow rate $Q_{OUT}$, which is the flow rate passing through the downstream-side valve V2, which is a control point, however, the estimation method used is different from that used for the valve flow rate $Q_{OUT}$ estimated by the valve flow rate estimation part 4 (described below), and the estimation accuracy thereof is also different, and for this reason, the separate term 'map flow rate' is used.

This map flow rate generator 31 receives inputs of the downstream-side pressure that was actually measured only when the initial values are in effect, and thereafter receives inputs of the downstream-side pressure estimated by the downstream-side pressure estimator 34 (described below). In addition, a manipulated variable output from the flow rate control part 5 during that control cycle is input as valve opening related value into the map flow rate generator 31. The map flow rate generator 31 inserts the input downstream-side pressure and manipulated variable into a function that shows the flow rate characteristics, and as a result, calculates and outputs a map flow rate, which is an estimated value for the valve flow rate.

The resistance flow rate estimator 32 receives inputs of the actually measured downstream-side pressure only when the initial values are in effect, and thereafter receives inputs of the estimated downstream-side pressure. In addition, the upstream-side pressure measured by the upstream-side pressure sensor P1 is input during each control cycle into the resistance flow rate estimator 32. The resistance flow rate estimator 32 calculates and estimates the resistance flow rate $Q_R$ based on a differential between the upstream-side pressure and the downstream-side pressure that are input, and on a function showing characteristics of the fluid resistor R. Here, the values actually measured by the pressure-based flow rate sensor match perfectly during the initial control cycle, however, in the second and subsequent control cycles, because estimated downstream-side pressures are used, deviations arise between the resistance flow rate $Q_R$ estimated by the resistance flow rate estimator 32 and the resistance flow rate $Q_R$ actually measured by the pressure-based flow rate sensor. More specifically, because downstream-side pressures that are arithmetically estimated and that, essentially, contain no noise are used by the resistance flow rate estimator 32, any noise shown in the resistance flow rate output as an estimated value can also be reduced.

The flow rate calculator 33 estimates the volumetric space internal flow rate $Q_{P2}$, based on the map flow rate estimated by the map flow rate generator 31, and on the resistance flow rate estimated by the resistance flow rate estimator 32. Here, because a value obtained by subtracting the flow rate flowing out of the volumetric space from the flow rate flowing into this volumetric space corresponds to the volumetric space internal flow rate $Q_{P2}$, the flow rate calculator 33 outputs a value obtained by subtracting the estimated map flow rate from the estimated resistance flow rate $Q_R$ as the volumetric space internal flow rate $Q_{P2}$.

The downstream-side pressure estimator 34 estimates the downstream-side pressure by integrating the estimated volumetric space internal flow rates $Q_{P2}$ output from the flow rate calculator 33.

As is described above, the actually measured values for the downstream-side pressure are only used for the initial values, and thereafter, the estimation of the volumetric space internal flow rates $Q_{P2}$ is repeatedly performed using downstream-side pressures estimated by the downstream-side pressure estimator 34. Because of this, after the initial time, there is no superimposed noise in estimations of the volumetric space internal flow rates $Q_{P2}$, and the estimations of the volumetric space internal flow rates $Q_{P2}$ converge. In addition, because differential operators are not used in the estimation process, and only integration operations are performed, there is no amplification of noise in the estimations of the volumetric space internal flow rates $Q_{P2}$, and the downstream-side pressure.

The valve flow rate estimation part 4 estimates a flow rate in the downstream-side valve V2, which is a flow rate control point, based on the resistance flow rate $Q_R$ measured by the resistance flow rate measurement mechanism, and on the volumetric space internal flow rates $Q_{P2}$ estimated by the volumetric internal flow rate estimation part 3. More specifically, the valve flow rate estimation part 4 estimates values obtained by subtracting the volumetric space internal flow rate $Q_{P2}$ from the resistance flow rate $Q_R$ at each control cycle as the valve flow rate $Q_{OUT}$. Here, the valve flow rates $Q_{OUT}$ estimated by the valve flow rate estimation part 4 have a superior estimation accuracy compared to the map flow rates, which are valve flow rates estimated by the map flow rate generator 31, due to the fact that they use the actually measured resistance flow rates $Q_R$. Because of this, these values are used for the estimators that are used to determine the manipulated variables of the downstream-side valve V2. In contrast, instead of using absolute flow rate values, the map flow rates estimated by the map flow rate generator 31 are used with the object of bringing the change trend during startup closer to the actual state.

In this way, time differential operations are not performed in order to estimate both volumetric space internal flow rate $Q_{P2}$ and the valve flow rate $Q_{OUT}$.

The flow rate control part 5 controls the downstream-side valve V2 based on a set flow rate set by a user, and on the valve flow rate $Q_{OUT}$ input from the valve flow rate estimation part 4. In other words, the flow rate control part 5 controls the downstream-side valve V2 using feedback from the valve flow rate $Q_{OUT}$ estimated as the gas flow rate flowing out from the downstream-side valve V2 such that a deviation between the set flow rate and the valve flow rate $Q_{OUT}$ is reduced. In the first embodiment, the flow rate control part 5 decides the value of the voltage applied to the downstream-side valve V2, which is a manipulated variable, by performing a PID operation on the deviation between the set flow rate and the estimated valve flow rate $Q_{OUT}$. At this time, a voltage that corresponds to the value calculated via the PID operation by the flow rate control part 5 is applied to the downstream-side valve V2, and the voltage value at this time is also output to the volumetric space internal flow rate estimation part 3.

The pressure control part 6 performs PID control of the upstream-side valve V1 based on the set voltage set by a user, and on the upstream-side pressure measured by the upstream-side pressure sensor P1. In other words, the pressure control part 6 uses feedback from the upstream-side pressure so as to control the upstream-side pressure such that a deviation between the set pressure and the upstream-side pressure is reduced. Here, the set pressure is set based on the pressure differential needing to be maintained on either side of the fluid resistor R when the valve flow rate $Q_{OUT}$ has been stabilized at the set flow rate.

In this way, control of the pressure by the upstream-side valve V1 and control of the flow rate by the downstream-side valve are each performed independently.

Figure 4:
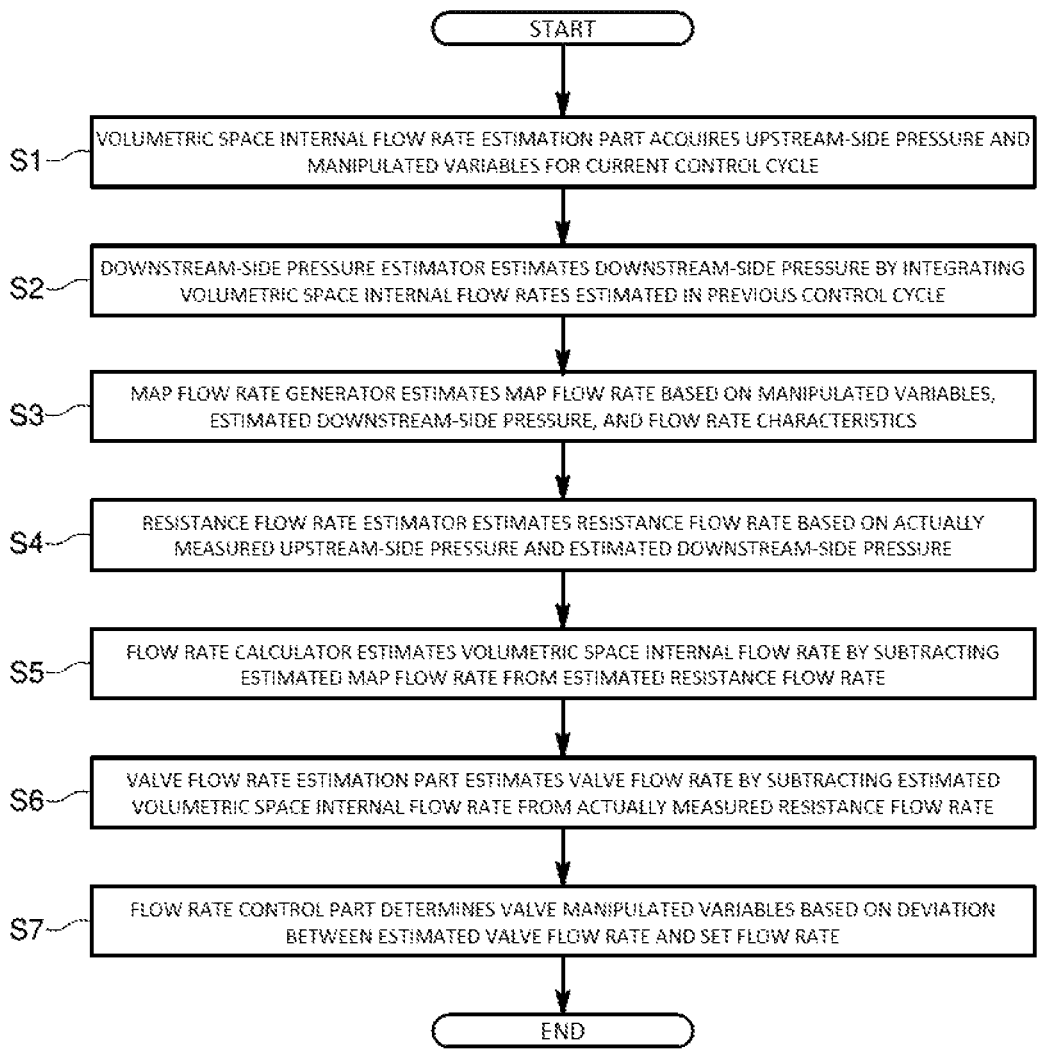
FIG. 4 is a flow chart showing a control operation of the flow rate control apparatus of the first embodiment.

Next, an operation performed in the second and subsequent control cycles of the flow rate control apparatus 100 having the above-described structure will be described with reference to the flow chart shown in FIG. 4.

Firstly, the volumetric space internal flow rate estimation part 3 acquires the upstream-side pressure measured by the upstream-side pressure sensor P1, and a voltage value that is the manipulated variable input into the downstream-side control valve V2 by the flow rate control part 5 in the current control cycle (step S1).

The downstream-side pressure estimator 34 of the volumetric space internal flow rate estimation part 3 then estimates the value of the downstream-side voltage by integrating the volumetric space internal flow rates $Q_{P2}$ estimated during the previous control cycle (step S2).

The map flow rate generator 31 of the volumetric space internal flow rate estimation part 3 then inserts the actually measured manipulated variable and the downstream-side pressure estimated by the downstream-side pressure estimator 34 into the stored flow rate characteristics function, and outputs a map flow rate which is an estimated valve flow rate (step S3). Here, because a downstream-side pressure that is an estimated value, and in which it is difficult for noise to be included in comparison with an actually measured value is input into the map flow rate generator 31, it is also difficult for noise to be superimposed on the output map flow rate. In addition, a map flow rate more accurately reflects the change tendency of the actual valve flow rate $Q_{OUT}$, particularly during a transient response, than does the actually measured resistance flow rate $Q_R$.

Furthermore, in parallel with this, the resistance flow rate estimator 32 of the volumetric space internal flow rate estimation part 3 estimates the value of the resistance flow rate $Q_R$ from the differential between the actually measured upstream-side pressure and the estimated downstream-side pressure (step S4). Here, because the upstream-side pressure is an actually measured value, while the downstream-side pressure is an estimated value in which it is difficult for noise to be included, it is difficult for noise to be superimposed on the estimated resistance flow rate $Q_R$ even if a differential operation is performed.

Next, the flow rate calculator 33 of the volumetric space internal flow rate estimation part 3 estimates the volumetric space internal flow rate $Q_{P2}$ in the current control cycle by subtracting the estimated map flow rate from the estimated resistance flow rate (step S5).

Next, the valve flow rate estimation part 4 subtracts the estimated volumetric space internal flow rate $Q_{P2}$ from the resistance flow rate $Q_R$ measured by a flow rate sensor, and estimates this as the valve flow rate $Q_{OUT}$ (step S6). In this way, because the valve flow rate $Q_{OUT}$ is calculated by subtracting the resistance flow rate $Q_R$ actually measured by a flow rate sensor from the volumetric space internal flow rate $Q_{P2}$ estimated from the map flow rate, without unmodified map flow rates that are valve flow rates output by the map flow rate output part 3 having to be used, even if some external disturbance does intrude into the flow path, the resulting change can be immediately reflected in the valve flow rate $Q_{OUT}$, which is an estimated value, so that the robustness of the flow rate control is vastly improved.

Note that no differential operation is performed in step S2 through step S6. In addition, even if a differential operation were to be performed, at least one value is a low-noise level estimated value, so that there is no amplification of noise in the operation results. Because of this, the estimation accuracy of the valve flow rate $Q_{OUT}$ that is ultimately obtained can also be improved.

The flow rate control part 5 decides a manipulated variable in a current control cycle based on the deviation between the estimated valve flow rate $Q_{OUT}$ and the set flow rate, and applies the corresponding voltage to the downstream-side valve V2 (step S7).

The same type of operations are thereafter repeated in each subsequent control cycle. Note that the control of the upstream-side valve V1 by the pressure control part 6 is performed independently of the flow rate control part 5, and the valve opening of the upstream-side valve V1 is continuously controlled such that the upstream-side pressure measured in the upstream-side volumetric space is continuously maintained at the set pressure.

According to the flow rate control apparatus 100 of the first embodiment having the above-described structure, the valve flow rate $Q_{OUT}$, which is the flow rate flowing out from the downstream-side valve V2, can be estimated based on the resistance flow rate $Q_R$ that can be actually measured, a voltage value which is a manipulated variable input into the downstream-side valve V2, and on the upstream-side pressure, without a time differential operation having to be performed based on previously measured flow rate characteristics.

Because of this, in the estimated valve flow rate $Q_{OUT}$, it is possible to maintain noise at a low level without any noise that is superimposed on an actually measured value being magnified by a differential operation. Accordingly, even if the estimated valve flow rate $Q_{OUT}$ is fed back to the flow rate control part 5, it is still difficult for the control to become unstable.

Moreover, because the estimation of the volumetric space internal flow rate $Q_{P2}$ is performed not by referring to the downstream-side pressure, which is the pressure in the downstream-side volumetric space VL through which that volumetric space internal flow rate $Q_{P2}$ is flowing, but by referring to the upstream-side pressure in which, because this is the pressure on the upstream side of the fluid resistor R, it is difficult for abrupt pressure changes to occur even if the valve opening of the downstream-side valve V2 changes, it is easy to ensure that the estimated volumetric space internal flow rate $Q_{P2}$ and the valve flow rate $Q_{OUT}$ are stabilized. Because of this, it is possible to prevent control of the downstream-side valve V2 becoming unstable because of large-scale variations in the estimated values.

Furthermore, because the downstream-side valve V2 is controlled by feeding back the valve flow rate $Q_{OUT}$ that is estimated as the flow rate flowing out of the downstream-side valve V2, which is a control point, it is possible to reduce any time delay between the actual flow rate and the fed back flow rate in a transient state, and to thereby improve the tracking speed in response to changes in the set flow rate in comparison with the conventional technology. In other words, a response speed that is widely demanded in a semiconductor manufacturing process can be achieved.

In addition, because the control is performed by the upstream-side valve V1 such that the pressure on the upstream side of the flow rate resistor R is constantly maintained at a set pressure, it is difficult for pressure variations to occur, and even after the flow rate of a gas passing through the downstream-side valve V2 has been stabilized at the set flow rate by the control of that downstream-side valve V2, it is easy for that flow rate to continue to be maintained. In other words, in a steady state, control of the flow rate of a gas flowing out of the downstream-side valve V2 can be made more robust.

Next, a variant example of the first embodiment will be described. The volumetric space internal flow rate estimation part 3 is formed so as to estimate the volumetric space interior flow rate $Q_{P2}$ by firstly estimating the map flow rate $Q_{OUT}$, which is a valve flow rate, and then subtracting the estimated resistance flow rate $Q_R$ therefrom. However, it is also possible for the volumetric space interior flow rate $Q_{P2}$ to be output directly, for example, from the valve opening related value, which is an actually measured input value, and from the pressure on the upstream side of the downstream-side valve V2.

More specifically, as the flow rate characteristics, flow rate characteristics are created in advance in which a manipulated variable, and either the downstream-side pressure measured by the downstream-side pressure sensor P2 or the upstream-side pressure measured by the upstream-side pressure sensor P1 are used as input variables, and the volumetric space internal flow rate $Q_{P2}$ is used as an output variable, and the volumetric space internal flow rate estimation part 3 obtains the volumetric space internal flow rates $Q_{P2}$ by substituting actually measured respective values. Using this type of structure as well, it is also possible estimate the valve flow rate $Q_{OUT}$ without using a differential operation, and reduce the noise to a greater extent than is possible using the conventional technology.

Figure 5:
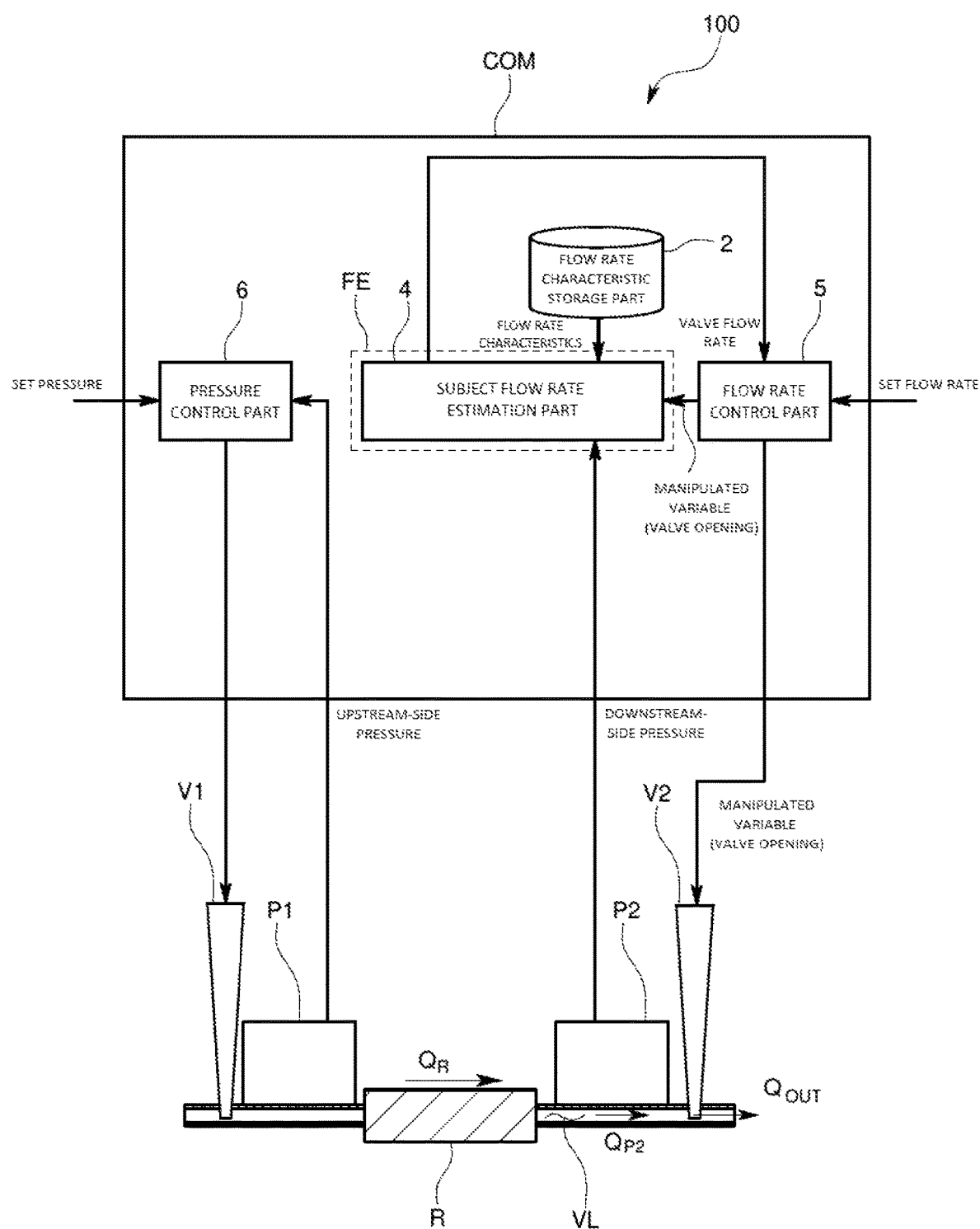
FIG. 5 is a schematic view showing a variant example of the flow rate control apparatus of the first embodiment.

Yet another variant example of the first embodiment will now be described. As is shown in FIG. 5, it is also possible for a subject flow rate estimation part 35 to receive inputs of a downstream-side pressure actually measured by the downstream-side pressure sensor P2, and of a manipulated variable in the form of a valve opening related value output from the flow rate control part 5, and to directly output the valve flow rate $Q_{OUT}$ without estimating the volumetric space internal flow rate $Q_{P2}$ based on the flow rate characteristics. In other words, without having to perform calculations such as those shown in FIG. 2 and FIG. 3, it is possible to ensure that the valve flow rate $Q_{OUT}$ is output from a map of the flow rate characteristics using two actually measured values, and to enable the flow rate control part 5 to control the valve opening of the downstream-side valve V2 using those values.

In this type of structure as well, because it is not necessary to perform a differential operation in order to estimate the valve flow rate $Q_{OUT}$, the noise component of the estimated valve flow rate $Q_{OUT}$ can be reduced to a greater extent than when an estimation method that requires a differential operation is employed. Because of this, it is possible to enable a response to be made more rapidly when performing flow rate control, at the same time as the stability of the control is improved compared to conventional flow rate control that uses valve flow rates estimated using a differential operation.

Figure 6:
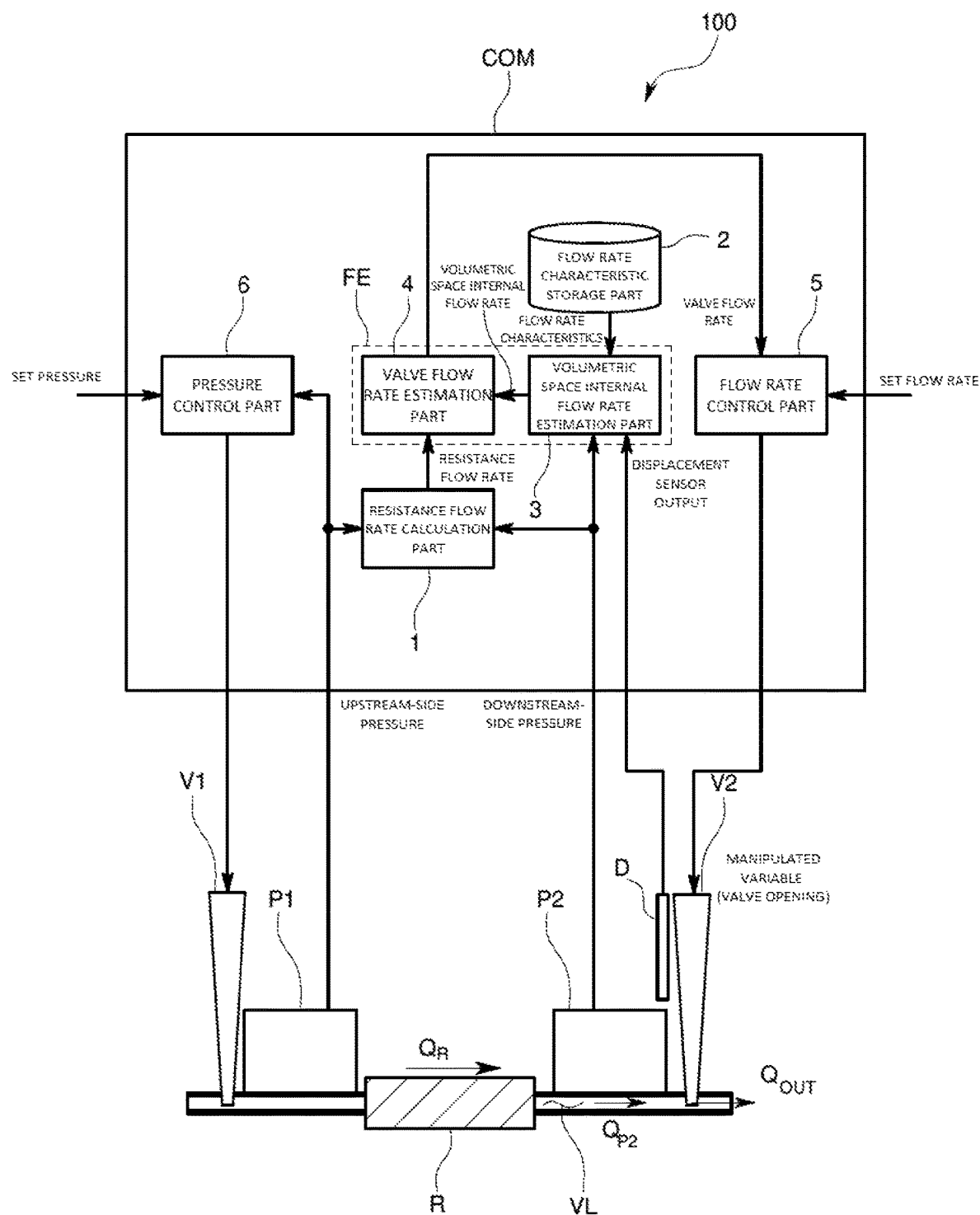
FIG. 6 is a schematic view showing a flow rate control apparatus according to a second embodiment of the present invention.

Next, a second embodiment of the present invention will be described with reference to FIG. 6. Note that component elements that correspond to component elements of the first embodiment are given the same descriptive symbols.

In a flow rate control apparatus 100 of the second embodiment, the input variable used to estimate the volumetric space internal flow rate $Q_{P2}$ is different from that of the first embodiment. In other words, the downstream-side valve V2 of the flow rate control apparatus 100 of the second embodiment is equipped with a displacement sensor D that is used to measure the valve opening of the downstream-side valve V2.

Moreover, the volumetric space internal flow rate estimation part 3 is configured so as to use, as the valve opening related values, output values for the valve opening that are given by the displacement sensor D, and to estimate the volumetric space internal flow rate $Q_{P2}$ using, as the pressure on the upstream side of the downstream-side valve V2, the downstream-side pressure measured by the downstream-side pressure sensor P2. Because of this, the flow rate characteristics are defined as a function in which the valve opening given by the displacement sensor D and the volumetric space internal flow rate $Q_{P2}$ corresponding to the downstream-side pressure are actually measured in advance, and these two values are used as input variables.

The valve flow rate estimation part 4 estimates the valve flow rate $Q_{OUT}$ based on the volumetric space internal flow rate $Q_{P2}$ that was estimated on the basis of the output values from the displacement sensor D and the downstream-side pressure, and on the resistance flow rate $Q_R$ measured by the flow rate sensor.

In this type of structure as well, it is possible to prevent noise from being reflected to a large extent in the estimated valve flow rate $Q_{OUT}$ without it being necessary to perform time differential processing on each of the input variables in order to estimate the valve flow rate $Q_{OUT}$. In addition, in a transient response state, even if a time delay is generated in the resistance flow rate $Q_R$ compared to the flow rate actually passing through the downstream-side valve V2, it is still possible to improve the flow rate control response speed as a result of the feedback control being performed using the estimated valve flow rate $Q_{OUT}$ having a smaller time delay.

Figure 7:
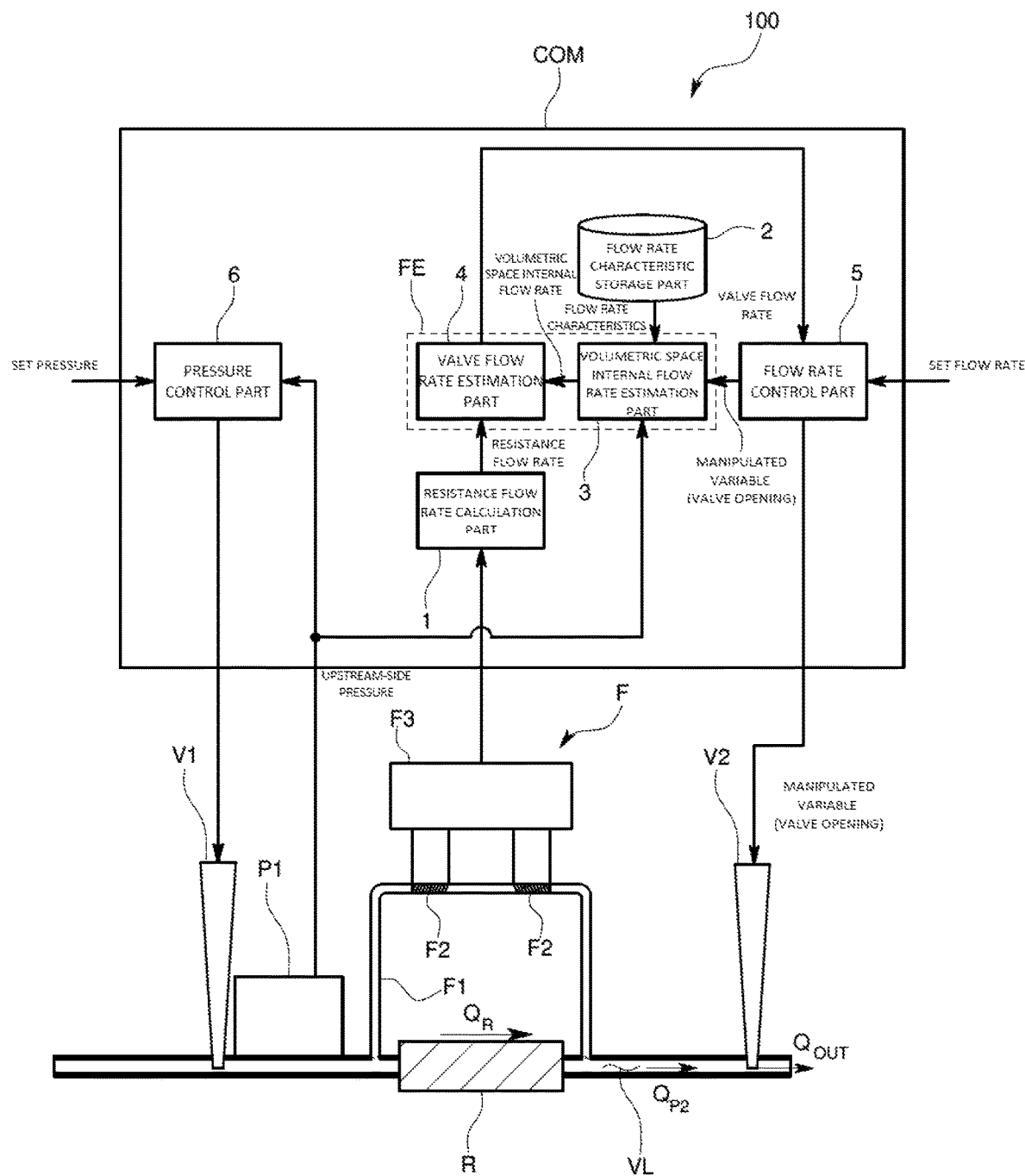
FIG. 7 is a schematic view showing a flow rate control apparatus according to a third embodiment of the present invention.

A third embodiment will now be described with reference to FIG. 7. Note that component elements that correspond to component elements of the first embodiment are given the same descriptive symbols.

In a flow rate control apparatus 100 of the third embodiment, the principle used to calculate the resistance flow rate $Q_R$ is different from that used in the first embodiment, and the downstream-side pressure sensor P2 is omitted. More specifically, the flow rate control apparatus 100 of the third embodiment is configured such that, instead of using measurement values from pressure sensors provided at the front and rear of the fluid resistor R, a separate thermal flow rate detection mechanism F that is used to measure a flow rate is provided, and a resistance flow rate calculation part 11 calculates the resistance flow rate $Q_R$ based on outputs from this thermal flow rate detection mechanism F.

In other words, in the third embodiment, as the thermal flow rate detection mechanism F there are provided a narrow pipe F1 that branches off from the flow path at the front and rear of the fluid resistor R so as to straddle the fluid resistor R, two heat transfer coils F2 that are wound around the narrow pipe F1, and a flow rate detecting device F3 that is configured by a bridge circuit that is configured so as to maintain each heat transfer coil F2 at a predetermined temperature. The voltage that is applied to the respective heat transfer coils F2 changes in accordance with the flow rate of a fluid flowing through the narrow pipe F1. The resistance flow rate calculation part 11 calculates the resistance flow rate $Q_R$ based on differences between the voltages output from the flow rate detecting device F3. In other words, in the third embodiment, a thermal flow rate sensor is configured by the flow rate detection mechanism F and the resistance flow rate calculation part 11.

Note that in this third embodiment as well, in the same way as in the first embodiment, the volumetric space internal flow rate estimation part 3 estimates the volumetric space flow rate $Q_{P2}$ based on the upstream-side pressure measured by the upstream-side pressure sensor P1, and on the manipulated variables of the downstream-side valve V2 output from the flow rate control part 5.

In this type of structure as well, a flow rate actually flowing through the downstream-side valve V2 is estimated as the valve flow rate $Q_{OUT}$ based on the resistance flow rate $Q_R$ and on the estimated volumetric space internal flow rate $Q_{P2}$, and flow rate control can be performed while reducing time delays based on the estimated valve flow rate $Q_{OUT}$. Additionally, in the third embodiment as well, because it is not necessary to perform a measured time differential operation at the time when the volumetric space internal flow rate $Q_{P2}$, and the estimated valve flow rate $Q_{OUT}$ are being estimated, it is possible to prevent any noise superimposed on the measured values from being augmented and being subsequently reflected in the estimated values. Accordingly, it is possible to improve responsiveness, particularly in a transient response state, at the same time as the stability of the flow rate control is maintained.

Other embodiments will now be described.

Instead of the flow rate control apparatus being provided with the upstream-side valve, it is also possible for the fluid device to be configured only by the upstream-side pressure sensor, the fluid resistor, the downstream-side pressure sensor, and the downstream-side valve. In other words, instead of performing pressure control to maintain the pressure on the upstream side of the fluid resistor at a constant pressure, it is possible to use the downstream-side valve in order to perform feedback control of the flow rate based on a second flow rate such as is described in the first embodiment. In this type of structure as well, by matching the flow rate measurement point with the control point, the effect of improving the response speed is obtained.

The fluids controlled by this fluid control apparatus are not limited to gases, and this fluid control apparatus may also be used to control liquids.

It is also possible for the upstream-side valve to be provided with a displacement sensor, and for this displacement sensor to be used to detect the valve opening of the upstream-side valve.

Moreover, in order to enable a flow rate that is achieved in an extremely short time via the fluid control apparatus of the present invention to be supplied unmodified to, for example, a chamber or the like it is also possible for the downstream-side valve to be disposed on the flow path adjacent to an intake port of that chamber.

Instead of using a function it is also possible for the flow rate characteristics to be in table form, and for the volumetric space internal flow rate estimation part 3 to pick up the volumetric space internal flow rate $Q_{P2}$ that corresponds to the valve opening related value and upstream-side pressure by referring to this table. In addition, the number of different types of parameter used to estimate the volumetric space internal flow rate $Q_{P2}$ is not limited to two, and a multivariable approach may also be employed. For example, the type of fluid and the peripheral temperature and the like may also be added as parameters and used to further improve accuracy when estimating the volumetric space internal flow rate $Q_{P2}$.

Furthermore, it should be understood that the present invention is not limited to the above-described embodiment, and that various modifications and the like may be made thereto insofar as they do not depart from the spirit or scope of the present invention.

DESCRIPTION OF THE REFERENCE CHARACTERS

100 . . . Flow rate control apparatus
V1 . . . Upstream-side valve
V2 . . . Downstream-side valve
P1 . . . Upstream-side pressure sensor
P1 . . . Upstream-side pressure sensor
R . . . Fluid resistor
VL . . . Downstream-side volumetric space
1 . . . Resistance flow rate calculation part
2 . . . Flow rate characteristic storage part
FE . . . Subject flow rate estimation part
3 . . . Volumetric space internal flow rate estimation part
31 . . . Map flow rate genera
32 . . . Resistance flow rate estimator
33 . . . Flow rate calculator
34 . . . Downstream-side pressure estimator
35 . . . Loop switch
4 . . . Valve flow rate estimation part
5 . . . Flow rate control part
6 . . . Pressure control part

What is claimed is:

1. A flow rate control apparatus comprising:
a fluid resistor that is provided on a flow path;
a downstream-side valve that is provided on a downstream side of the fluid resistor;
a resistance flow rate measurement mechanism that measures a resistance flow rate that flows through the fluid resistor, and flows into a volumetric space located on the flow path between this fluid resistor and the downstream-side valve;
a flow rate characteristics storage part in which are stored flow rate characteristics that show a relationship between an valve opening related value which is related to an valve opening of the downstream-side valve, a pressure on an upstream side of the downstream-side valve, and either a valve flow rate flowing out from the volumetric space via the downstream-side valve, or a volumetric space internal flow rate flowing through an interior of the volumetric space;
a subject flow rate estimation part that estimates a valve flow rate based on the flow rate characteristics stored in the flow rate characteristics storage part; and
a flow rate control part that controls the downstream-side valve based on a set flow rate, and on the valve flow rate estimated by the subject flow rate estimation part, wherein
the subject flow rate estimation part is configured so as to estimate a valve flow rate based on the valve opening related value achieved by the flow rate control part, the measured upstream-side pressure, and the flow rate estimated based on the flow rate characteristics, and also on the resistance flow rate measured by the resistance flow rate measurement mechanism.

2. The flow rate control apparatus according to claim 1, wherein the subject flow rate estimation part comprises:
a volumetric space internal flow rate estimation part that estimates an internal flow rate inside a volumetric space based on the valve opening related value, the pressure on the upstream side of the downstream-side valve, and the flow rate characteristics; and a valve flow rate estimation part that estimates a valve flow rate flowing out from the volumetric space via the downstream-side valve based on the resistance flow rate measured by the resistance flow rate measurement mechanism, and on the estimated volumetric space internal flow rate.

3. The flow rate control apparatus according to claim 1, wherein the valve flow rate estimation part estimates a valve flow rate based on a difference between a resistance flow rate and a volumetric space internal flow rate.

4. The flow rate control apparatus according to claim 1, wherein the flow rate characteristics are configured by a multivariable function in which the valve opening related value and the pressure on the upstream side of the downstream-side valve form input variables, and the valve flow rate forms an output variable, and this multivariable function does not include a differential operator that influences the input variables.

5. The flow rate control apparatus according to claim 4, wherein the pressure on the upstream side of the downstream-side valve is a downstream-side pressure, which is the pressure in a volumetric space in the flow path between the fluid resistor and the downstream-side valve, and the volumetric space internal flow rate estimation part comprises:

a map flow rate generator that outputs a map flow rate, which is a valve flow rate estimated based on the valve opening related value, the downstream-side pressure, and the flow rate characteristics;

a resistance flow rate estimator that outputs an estimated resistance flow rate based on an upstream-side pressure, which is a pressure on the upstream side of the fluid resistor, and on the downstream-side pressure;

a flow rate calculator that calculates a volumetric space internal flow rate based on the map flow rate output from the map flow rate generator, and on the resistance flow rate estimated by the resistance flow rate estimator; and a downstream-side pressure estimator that estimates a downstream-side pressure by integrating volumetric space internal flow rates calculated by the flow rate calculator, wherein the map flow rate generator is configured so as to output a map flow rate based on the downstream-side pressure estimated by the downstream-side pressure estimator.

6. The flow rate control apparatus according to claim 1, wherein the resistance flow rate estimation mechanism is provided with:

an upstream-side pressure sensor that is provided on an upstream side of the fluid resistor;

a downstream-side pressure sensor that measures a pressure in a volumetric space in the flow path between the fluid resistor and the downstream-side valve; and a resistance flow rate calculation part that calculates a resistance flow rate based on the upstream-side pressure measured by the upstream-side pressure sensor, and on the downstream-side pressure measured by the downstream-side pressure sensor, wherein the flow rate control part is configured so as to output a manipulated variable that is input into the downstream-side valve based on a deviation between a set flow rate and a valve flow rate, and the subject flow rate estimation part is configured so as to estimate a valve flow rate based on the upstream-side pressure measured by the upstream-side pressure sensor, which is the pressure on the upstream side of the downstream-side valve, on the manipulated variable output by the flow rate control part, which is the valve opening related value, and on the flow rate characteristics.

7. The flow rate control apparatus according to claim 6, further comprising:

an upstream-side valve provided on the upstream side of the fluid resistor; and a pressure control part that controls the upstream-side valve based on the set pressure and on the upstream-side pressure measured by the upstream-side pressure sensor.

8. A flow rate control method according to the present invention uses a flow rate control device that includes a fluid resistor that is provided on a flow path, a downstream-side valve that is provided on a downstream side of the fluid resistor, and a resistance flow rate measurement mechanism that measures a resistance flow rate that flows through the fluid resistor, and flows into a volumetric space located on the flow path between this fluid resistor and the downstream-side valve, and comprises:

a flow rate characteristics acquisition step in which are acquired flow rate characteristics that show a relationship between an valve opening related value which is related to an valve opening of the downstream-side valve, a pressure on an upstream side of the downstream-side valve, and either a valve flow rate flowing out from the volumetric space via the downstream-side valve, or a volumetric space internal flow rate flowing through an interior of the volumetric space;

a subject flow rate estimation step in which a valve flow rate is estimated based on the flow rate characteristics acquired in the flow rate characteristics acquisition step; and a flow rate control step in which the downstream-side valve is controlled based on a set flow rate, and on the valve flow rate estimated in the subject flow rate estimation step, wherein, in the subject flow rate estimation step, the valve flow rate is estimated based on the valve opening related value achieved in the flow rate control step, the measured upstream-side pressure, and the flow rate estimates based on the flow rate characteristics, and also on the resistance flow rate that is measured by the resistance flow rate measurement mechanism.

9. A program recording medium on which is recorded a program that is used in a flow rate control apparatus that includes a fluid resistor that is provided on a flow path, a downstream-side valve that is provided on a downstream side of the fluid resistor, and a resistance flow rate measurement mechanism that measures a resistance flow rate that flows through the fluid resistor, and flows into a volumetric space located on the flow path between this fluid resistor and the downstream-side valve, the program enabling a computer to function as:

a flow rate characteristics storage part in which are stored flow rate characteristics that show a relationship between an valve opening related value which is related to an valve opening of the downstream-side valve, a pressure on an upstream side of the downstream-side valve, and either a valve flow rate flowing out from the volumetric space via the downstream-side valve, or a volumetric space internal flow rate flowing through an interior of the volumetric space;

a subject flow rate estimation part that estimates a valve flow rate based on the flow rate characteristics stored in the flow rate characteristics storage part; and a flow rate control part that controls the downstream-side valve based on a set flow rate, and on the valve flow rate estimated by the subject flow rate estimation part, wherein the subject flow rate estimation part is configured so as to estimate a valve flow rate based on the valve opening related value achieved by the flow rate control part, the measured upstream-side pressure, and the flow rate estimated based on the flow rate characteristics, and also on the resistance flow rate measured by the resistance flow rate measurement mechanism.

* * * * *